(12) United States Patent
Yoon et al.

(10) Patent No.: US 6,502,046 B1
(45) Date of Patent: Dec. 31, 2002

(54) LAPLACE TRANSFORM IMPEDANCE SPECTROMETER AND ITS MEASUREMENT METHOD

(75) Inventors: Chul-Oh Yoon, Taejeon (KR); Yevgen Barsukov, Taejeon (KR); Jong-Hyun Kim, Seoul (KR)

(73) Assignee: Korea Kumbo Petrochemical Co. Ltd, Seoul (KR)

( * ) Notice: Subject to any disclaimer, the term of this patent is extended or adjusted under 35 U.S.C. 154(b) by 0 days.

(21) Appl. No.: 09/476,452

(22) Filed: Dec. 30, 1999

(30) Foreign Application Priority Data

Mar. 13, 1999 (KR) .............................. 99-8460

(51) Int. Cl.[7] .................. G06F 17/50; G06F 19/00; G01R 23/16
(52) U.S. Cl. ................. 702/76; 250/386; 324/76.23; 388/811; 702/65; 702/67; 703/13; 703/14; 716/4
(58) Field of Search .............................. 702/49, 75, 76, 702/77, 79; 324/76.19, 76.21, 76.22; 716/4

(56) References Cited

U.S. PATENT DOCUMENTS

| | | | | |
|---|---|---|---|---|
| 3,634,760 A | * | 1/1972 | Murtin | 324/76.23 |
| 3,897,344 A | * | 7/1975 | Marshall, III et al. | 250/386 |
| 4,196,475 A | * | 4/1980 | Hall | 702/65 |
| 4,286,326 A | * | 8/1981 | Houdard | 702/76 |
| 4,973,174 A | * | 11/1990 | Losic et al. | 388/811 |
| 5,633,801 A | * | 5/1997 | Bottman | 702/65 |
| 5,794,008 A | * | 8/1998 | Meyers et al. | 716/4 |
| 5,890,097 A | * | 3/1999 | Cox | 702/67 |
| 5,946,482 A | * | 8/1999 | Barford et al. | 703/14 |
| 6,047,117 A | * | 4/2000 | Kahng et al. | 703/13 |

* cited by examiner

Primary Examiner—John S. Hilten
Assistant Examiner—John Le
(74) Attorney, Agent, or Firm—Davidson, Davidson & Kappel, LLC

(57) ABSTRACT

A method of measuring impedance is based on carrier function Laplace transform. The measurement includes detecting a response signal from a device under test, to which signal an excitation such as a pulse, interrupt or constant load is applied. Resulting data is fitted to a carrier function, selected so as to be capable of providing a good fit and for which an analytical Laplace transform is known, in order to obtain parameters of such function providing best fit. Obtained parameters are further substituted into the analytical expression of Laplace transform of carrier function which is used to calculate a frequency dependent impedance function in the Laplace domain. The resulting impedance function is used for calculating the impedance spectrum in a frequency domain and for calculating the measurement error of the frequency domain impedance spectrum using the standard deviations of the parameters, obtained during fitting of time-domain data.

4 Claims, 7 Drawing Sheets

LAPLACE TRANSFORM IMPEDANCE SPECTROMETER AND ITS MEASUREMENT METHOD

TECHNICAL FIELD

The present invention relates to a Laplace transform impedance spectrometer and its measurement method. More particularly, the method of and apparatus for measuring Laplace transform impedance can provide a high quality of wide-ranged impedance spectrum measurement within a minimal time with, applicable to the various electrical circuits, non-linear devices, capacitors, and other electrochemical devices such as primary and secondary batteries and fuel cells.

BACKGROUND ART

The technique of measuring impedance spectrum of the electrical or electrochemical device can be widely applied to a characterization of an electrical circuit, material evaluation, corrosion protection, evaluation of properties, quality control and capacity estimation of batteries.

As a widely used measurement for impedance spectrum, there is a method of applying a periodic perturbation signal at a certain frequency, and measuring the amplitude and phase of the response, for example, by using frequency response analyzer.

U.S. Pat. Nos. 4,196,475 and 3, 634, 760 introduce a method of analyzing a response characteristic at a single frequency. But the method stated in the above patent applications has problems that it must use expensive devices such as a signal generator and phase detector, and it needs at least two periods of signal to remove transient effects. In addition, it takes a long time to proceed the successive measurements for each frequency when a spectrum at a plurality of frequencies is required.

When using the Fast-Fourier Transform (hereinafter, it is referred to FFT) in which a response signal is fast-Fourier transformed by means of an excitation signal of the multiple-superposed sine waves (refer to G. S. Popkirov and R. N. Schindler, Rev. Sci. Instrum. 63, 5336 (1992)), the phase detector is not required and the time required for the spectrum measurement with respect to the plurality of frequencies is relatively short in contrast to the method of using the frequency response analyzer.

Furthermore, the FFT method examines the linearity of the system for testing by comparing input and output power spectrums and thus provides a high quality of impedance spectra. The FFT method, however, takes more than double the measurement time corresponding to the period of the minimum frequency in the measurement frequency range and, besides, requires a complicated signal generator and a large capacity of memory device.

Since the applied perturbation signal is generated by superposition of non-overlapping frequencies, the impedance spectrum is obtained at odd times of the minimum frequency. Therefore, only a few number of impedance data points can be obtained at low frequency region.

U.S. Pat. No. 5,633,801 describes a method of using current pulse instead of a plurality of superposed sine waves in impedance measurement. In this method, however, considerable frequency dependent noise due to a frequency aliasing and transient effect sometimes cause a measurement error, thus having a problem in a reliability of the measurement results and confidence interval (W. J. Thomson and J. R. Macdonald, Proc. Natl. Acad. Sci. USA, 90, 6904 (1993)).

A method stated in U.S. Pat. No. 5,794,008, which uses a discrete Laplace transform in analyzing the pulse signal in order to get a high quality of measurement result at a frequency region, requires a long operation time and a large memory size.

The above method needs, in analysis, computation at each measurement data point, and the number of the measurement data points is determined as double of the ratio of the maximum and minimum frequencies so that in case of eight decades of measurement sections, one million times of computation process is required for one megabyte memory.

Integration step required for transformation sometimes gives oscillating results. It is also difficult to determine the accuracy of the measurement using this method, as in the pulse FFT, and if the system for testing is non-linear, it is possible to get the impedance spectrum from the measurement but there is no physical meaning on it.

DISCLOSURE OF INVENTION

Accordingly, an object of the present invention is to provide a carrier function Laplace transform impedance spectrometer and its measurement method, obtaining a high quality of wide-ranged impedance spectrum within a minimal time for characterization of the various electrical circuits, non-linear devices, capacitors, and other electrochemical devices such as primary, secondary batteries and fuel cells.

To accomplish an object of the present invention, a Laplace transform impedance spectrometer, includes:

a galvanostat/potentiostat for applying constant voltage, constant current or constant load to the electrochemical device by employing constant voltage source, constant current source or constant load element such as a resistor and thereby detecting voltage and current of the electrochemical device resulting from above excitation;

a voltage/current output unit for removing noise out of voltage and current detected in the galvanostat/potentiostat, also removing bias voltage and current and outputting signals;

a two channel analog/digital converter for converting the voltage and current output from the voltage/current output unit into digital signal; and a control means for fitting the digital voltage and current output from the analog/digital converter to Laplace transform carrier function to thereby generate impedance spectrum and storing its data.

To accomplish the other object of the invention, a method of measuring Laplace transform impedance, includes the steps of:

(1) detecting a response signal of an object whose impedance will be measured;

(2) obtaining parameters of a carrier function by linearly or non-linearly fitting the response signal in step (1) to the carrier function which has an analytical Laplace transform;

(3) calculating an impedance function in the frequency domain by using an analytic relation between the carrier function in time domain and its Laplace transform function, using parameters of the carrier function obtained through the fitting results in step (2);

(4) calculating the impedance spectrum in a frequency range determined by measurement interval and sampling rate by using impedance function calculated in step (3), and calculating the measurement error of the frequency domain impedance spectrum out of the standard deviation of the parameters and its correlation; and (5) displaying the frequency domain impedance spectrum calculated in step (4) in a fixed form and storing the result.

Specifically, the invention provides a Laplace transform spectrometer providing high measurement accuracy, speed and a simple architecture.

The invention relates to a method of obtaining impedance spectra by using Laplace transform carrier functions suitable for transient response of step signals. In a measurement, the spectrometer requires just a small size memory for computation and requires only linear operations on measured data which do not include integration. And, it is different from other art in that it allows use of a standard statistic means for assigning confidence interval to a frequency domain measurement data, providing therefore analysis of the quality of the measurement and the linearity of the system for testing.

BEST MODE FOR CARRYING OUT THE INVENTION

Hereinafter, a Laplace transform impedance spectrometer according to the present invention will be described with reference to the accompanying drawings.

Figure 1:
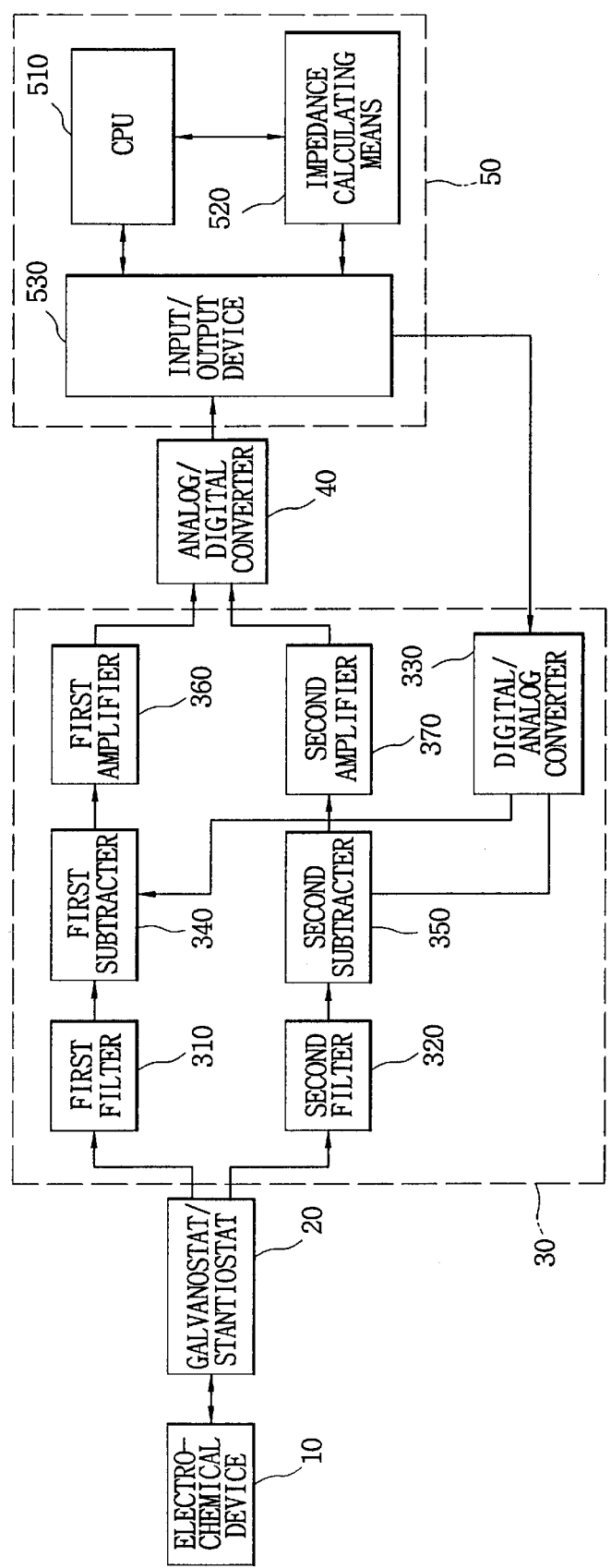
FIG. 1 is a block diagram showing the structure of a Laplace transform impedance spectrometer of the invention.

FIG. 1 shows a Laplace-transform impedance spectrometer of the invention.

As shown in FIG. 1, the present invention requires an electrical or electrochemical device 10 for testing such as electrical circuits, linear device, non-linear device, capacitor, primary and secondary batteries and fuel cells; a galvanostat/potentiostat for applying constant-voltage, a constant-current or constant-load to the electrical or electrochemical device 10 by employing a constant-load machine such as a constant-voltage source, constant-current source or resistor and thereby detecting the voltage or current variation of the electrical or electrochemical device 10, resulting from the application of the constant voltage, current or load; a voltage/current output unit 30 for removing noises of the voltage or current detected by the galvanostat/potentiostat 20, and also of the bias voltage or current and outputting the signal; a two-channel analog/digital converter 40 for converting the voltage or current output from the voltage/current output unit 30 into a digital signal in a desired sample extraction speed; and a control means 50 for fitting the digital voltage and current output from the analog/digital converter 40 to a carrier function, for which an analytical Laplace transform exists in order to generate an impedance spectrum and storing the result of calculation.

The voltage/current output unit 30 includes first and second filters 310 and 320 for removing noise by filtering from the voltage and current detected by the galvanostat/potentiostat 20; a digital/analog converter 330 for converting the digital bias voltage and current output from the control means into an analog bias voltage and current; first and second subtractors 340 and 350 for respectively subtracting the bias voltage and current from the digital/analog converter 330 from the voltage and current output from the first and second filters 310 and 320; and first and second amplifiers 360 and 370 for amplifying output signals of the first and second subtractors 340 and 350 and inputting them to the analog/digital converter 40.

The control means 50 includes CPU 510 for controlling a Laplace transform impedance measurement for the electrical or electrochemical device 10; an impedance calculation means 520 for measuring and computing the impedance spectrum of the electrical/electrochemical device 10 from the output signal of the analog/digital converter 40 under the control of CPU 510; and an input/output device 530 for inputting the output signal of the analog/digital converter 40 and outputting the digital bias voltage and current to the digital/analog converter 330 of the voltage/current outputting means 30.

The thus-configured carrier function Laplace transform impedance spectrometer is designed to operate the galvanostat/potentiostat 20 which applies an excitation signal such as a constant current or constant voltage to the electrical/electrochemical device 10 in a current pulse method or voltage pulse method, or interrupts the excitation signal applied to the electrical/electrochemical device 10 in a current interrupt method, or connects a constant load to the electrical/electrochemical device in a constant load method and finally detects the response signal, namely, the time-variation of the voltage or current.

In order to remove the high-frequency component of the voltage and current response signal detected, the voltage/current output unit 30 performs a low-pass filtering and removes bias. That is, the galvanostat/potentiostat 20 performs a low-pass filtering the detected voltage and current in the first and second filters 310 and 320 to thereby remove the high-frequency component. The first and second filters 310 and 320 outputs signals to the input/output device 530 according to the control of CPU 510 in the control means 50. The signals are converted into the analog signals in the digital/analog converter 330. The voltage and current bias are individually subtracted, and the resulting signals are amplified in the first and second amplifiers 360 and 370.

The voltage and current output from the voltage/current output unit 30 are converted into digital signals in the analog/digital converter 40 in a desired sample extraction speed. The digital signal is input to the input/output device

530 by the control means 50. The excitation signal and response signals digital-converted in the impedance measuring means 520 are fitted to a carrier function which is analytically Laplace-transformable by and thus the impedance function of the frequency region is obtained by using the parameter values obtained through the fitting.

Figure 2:
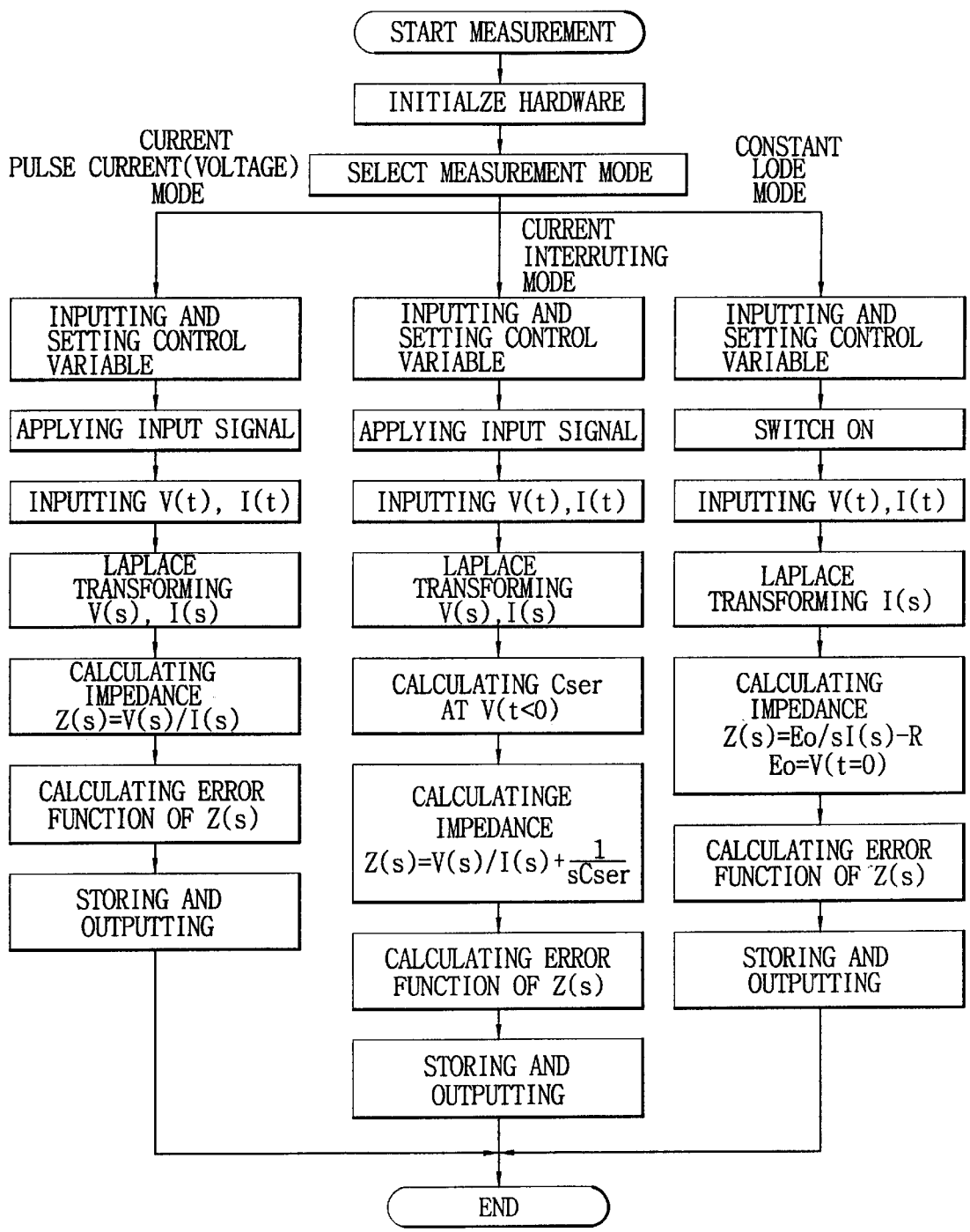
FIG. 2 is a signal flowchart showing a method of measuring the Laplace transform impedance of the invention.

FIG. 2 is a signal flow chart showing a method of measuring the Laplace transform impedance.

Hardware is first initialized and then a measurement mode is selected.

If the selected measurement mode is current pulse method or voltage pulse method, the constant current or voltage is applied as the excitation signal to the electrical/electrochemical device 10. Variation of the voltage V(t) or current I(t) of the electrical/electrochemical device 10 resulting from the application of the excitation signal is Laplace-transformed into V(s) and I(s) using carrier functions. The impedance function V(s) and I(s) is calculated from as Z(s)=V(s)/I(s). The error function of the calculated impedance Z(s) is also calculated and stored.

If the selected measurement mode is a current interrupt method, the input signal of the electrical/electrochemical device 10 is interrupted after pre-specified time. The variation of the voltage V(t) and current I(t) of the electrical/electrochemical device 10 is Laplace-transformed to V(s) and I(s) using carrier function, and serial capacitance $C_{ser}$ is determined from V(t<0) before interruption. With the Laplace transformed V(s) as well as I(s) and $C_{ser}$, Impedance is calculated as follows: $Z(s)=V(s)/I(s)+1/sC_{ser}$. The error function of the impedance Z(s) is also calculated and stored.

If the selected measurement mode is a constant load method, switch is turned on to thereby connect the constant resistor R with the electrical/electrochemical device 10. The variation of the voltage V(t) and current I(t) of the device 10 is input and thus the current I(t) is Laplace-transformed into I(s) using carrier function. From the Laplace-transformed I(s) and the constant resistance R, the impedance Z(s) is calculated as follows: $Z(s)=Eo/sI(s)-R$, where, $Eo=V(t=0)$. The error function of the calculated impedance Z(s) is also calculated and stored.

Hereinafter, the method of and apparatus for measuring carrier function Laplace transform impedance will be described in detail.

In applying the excitation signal such as current and voltage or load to the spectrometer, if the spectrometer is once excited through other step, we have to wait for more than the set time to apply the minimal excitation signal to thereby stabilize the system for testing.

The rise time of the signal for controlling the constant voltage and current excitation signal should be shorter than ½ of the sampling time (ts), and the sampling time is related to the maximum frequency $f_{max}$ as the following equation 1.

$$t_s = 1/2 \cdot f_{max} \qquad \text{[Equation 1]}$$

The magnitude of the applied excitation signal should be determined within range that the response of the system for testing remains linear.

For example, in the electrochemical system like battery, the product of the applied current and time should be less than 1/10 (generally, 1/20) of the total capacity of the battery.

Generally, if the confidence interval is wide enough in the low-frequency band, the size of the excitation signal should be reduced, while the response signal should be enlarged enough to obtain adequate signal to noise ratio.

The applying time of the excitation signal with respect to the minimum frequency $f_{min}$ is given as $1/f_{min}$.

In case the internal properties like the state of charge is changed by the application of the excitation signal as in the secondary battery, and thus it should be recovered to the original state after the impedance measurement, an inverse excitation signal to the desired measurement can be applied. For example, if the excitation signal of a constant current is used in the impedance measurement, the current of opposite sign is applied for same time and thus the state of the battery can be recovered. Here, the measuring of the response signal is not required.

The measurement method of the constant load impedance can be applied to the energy storing devices such as the charged capacitors, and batteries.

The resistor used as the constant load should be selected considering the maximal variation of the measured voltage.

In this case, the excitation signal for the recovery of the original state can not be applied, but as the discharging amount generated during the measurement is small, it can be used for the testing of the device.

Moreover, since the apparatus used for exciting the signal does not apply the signal exactly the same as the desired excitation signal, we need to measure the applied excitation signal. For instance, the potentiostat, a constant voltage controller, and the galvanostat, a constant current controller, generally have a limited rise time. And if the step type pulse signal is excited by using the apparatii, the actually applied signal is a mixture of the pulse and ramp rather than the ideal step pulse.

Therefore, this kind of problem can be corrected by measuring the actually applied excitation, but the oscillation at the moment of signal excitation or a long rise time may affect on the quality of the measurement result in the high frequency region.

In order to avoid the above problems, we may use the current interruption method.

This method is to interrupt the current after a predetermined time for applying the current and thus to determine the response signal.

In determining the response signal, a low-band pass filter is used in order to remove an aliasing effect.

The sampling time is, as shown in equation 1, selected by the maximum frequency $f_{max}$ to be measured, and the number of the measuring data points is required as many as $f_{max}/f_{min}$ to thereby memorize the measuring data with respect to the entire impedance spectrum from the minimum frequency $f_{min}$ to the maximum frequency $f_{max}$.

For instance, in case of extracting the 16 bit data, the required capacity of the memory device is 2 Mb for the measurement of 1 mHz to 1 kHz. If such amount of data information is stored in RAM, the cost for fabricating the measurement apparatus is thus increased.

Carrier function Laplace transform impedance measurement allows the extraction of data by logarithmic sampling in time interval without influencing the quality of the measurement.

In case of minimizing the number of the measuring data points by using the logarithmic sampling time interval, the number of data points may be 20~100 in case of the frequency range of 1 mHz to 1 kHz.

In order to reduce the influence from the noise during measurement, generally a thousand data points are enough and the capacity of the memory device required for the digital/analog converter employing the logarithmic sampling measurement method is about 2 Kb.

According to the method of measuring the Laplace transform impedance, the carrier function such as following equation 2 is used for fitting of the response signal in the time interval with respect to the current/voltage pulse and constant load excitation signal.

$$f(t) = \sum_{i=0}^{n} k_i e^{-\frac{t}{\tau_i}}$$ [Equation 2]

where the selection of the carrier function is based on a principle of electrical engineering that the response of the arbitrary linear circuit with respect to the impulse excitation time can be expressed as the equation 2, and $1/\tau I$ corresponds to zeros of the circuit.

The arbitrary form of excitation signal can be expressed as sum of a plurality of impulses so that this principle can be generalized to the any excitation signal.

To fit a specific signal, it is useful to fix the above zero values by the value distributed by log function from $1/ts$ to $2 f_{min}$.

The total number of zeros is determined according to the desired precision, and for example, during fitting, we may use a method where the number of the zero is automatically increased until the size of the least square of the error may be within the error tolerance range.

If such constant zeros are used, the values $k_i$ of the parameters in the equation 2 can be calculated by using a linear regression. This calculation can be performed faster than other fitting and is advantageous in that it does not use an initial parameter conditions.

The carrier function without zero corresponds to the ideal pulse and as the zeros are added, the function deviates from the ideal pulse.

Laplace transform of the carrier function in equation 2 is given by equation 3 with respect to the complex parameter s. Here, V(s) is a voltage signal carrier function; I(s) is a current signal carrier function.

$$(a) \; F(s) = L\{f(t)\} = \sum_{i=0}^{n} \frac{k_i}{\left[s + \frac{1}{\tau_i}\right]}$$ [Equation 3]

$(b) V(s)=L\{v(t)\}$ $(c) I(s)=L\{i(t)\}$

Impedance function is determined from the following equations 4 to 6 out of the correlation of the specific excitation signal and the response signal in the time domain.

$$Z(s) = \frac{V(s)}{I(s)} \quad \text{(current/voltage pulse method)}$$ [Equation 4]

$$Z(s) = \frac{V(s)}{I(s)} + \frac{1}{s \cdot C_{ser}} \quad \text{(current interruption method)}$$ [Equation 5]

$$Z(s) = \frac{E_0}{I(s) \cdot s} - R \quad \text{(constant load method)}$$ [Equation 6]

In equation 5, $C_{ser}$ is the value calculated from the slope of the response signal over time just before the applied signal is interrupted.

In equation 6, $E_o$ is open circuit voltage before the measurement of the tested device, and R is the value of the constant resistor connected to the tested device.

In case of the constant load measurement in equation 6, the initial state corresponds to the ideal potential pulse $E_o/s$ in the time domain, it does not need the is information about the excitation signal. The actual measurement apparatus does not require a function of applying the excitation signal other than connecting with the resistor, and thus is configured as a single input channel input device for measuring the current response signal.

By substituting $2\pi f_i$ ($f_{min} \leq f \leq f_{max}$) for parameter s with respect to the result of calculating each of the impedance functions with respect to the constant voltage, constant current or constant load by using the equations 3 to 6, we can get the impedance value of the tested device for each of frequencies.

By using the correlation between the standard deviation of the parameters and the linear regression in the time domain, we can calculate the deviation for each of calculation results in the frequency region, and thus calculate the statistic error of the frequency domain data using the statistic measurement out of the following equation 7.

$$\Delta Z(s) = D(s)^T \cdot C \cdot D(s)$$ [Equation 7]

Where D(s) is column vector made by differentiating the impedance values of equations 3 to 6 from s; and C is a covariance matrix calculated by linearly fitting the measured test data.

Embodiment 1

Measurement times respectively in the frequency scanning method using FRA, Fourier-transform impedance measurement method and carrier function Laplace-transform impedance measurement method are compared in table 1. Condition of the measuring frequency is ranged from 1 mHz to 1 kHz.

Laplace-transform impedance measurement employs the current pulse method and its apparatus is as follows. The current pulse defined at the galvanostat/potentiostat 20 is applied to the spectrometer, electrical/electrochemical device 10. The response signal of the spectrometer, namely, the terminal voltage and current are extracted as of digital value from the 2 channel 16 bit analog/digital converter 40 through the voltage/current output unit 30.

The extracted response signal is transmitted to the control means 50 and used for calculating complex impedance according to the Laplace transform algorithm.

In the FFT method, the current input signal of superposed sine waves at an odd frequency of minimum frequency is applied to battery through the 16 bit digital/analog converter and galvanostat. Then, the 2 channel 16 bit analog/digital converter measures the voltage and current of the spectrometer, and the complex impedance is calculated by using digital discrete Fourier transform algorithm.

TABLE 1

| Method of measurement | Frequency scanning method | Fourier transform method | Laplace transform method |
|---|---|---|---|
| Time required for measurement | 1.5 Hour | 33 Min. | 17 Min. |

From the above TABLE 1, we can recognize that the Laplace transform method is evidently at least more than two times faster than the FFT method and 5.3 times faster than frequency scanning method.

Embodiment 2

Dummy cell consisting of resistors and capacitors is charged by 1V and connected with the constant resistance 10 Ω. Variation of voltage for 1000 seconds is measured by time function.

The voltage response signal of the battery is transmitted through the low-band pass filter and differential amplifier and then sample-extracted in speed of 1 kHz through the 16 bit analog/digital converter. Here, the dummy cell is made by connecting RC element where 10 Ω resistance and 10° F. capacitor are connected in series and other RC element where 1 Ω resistance and 1F capacitor are connected in parallel.

The complex impedance spectrum is obtained by transforming the voltage data obtained according to the Laplace transform algorithm.

Figure 3:
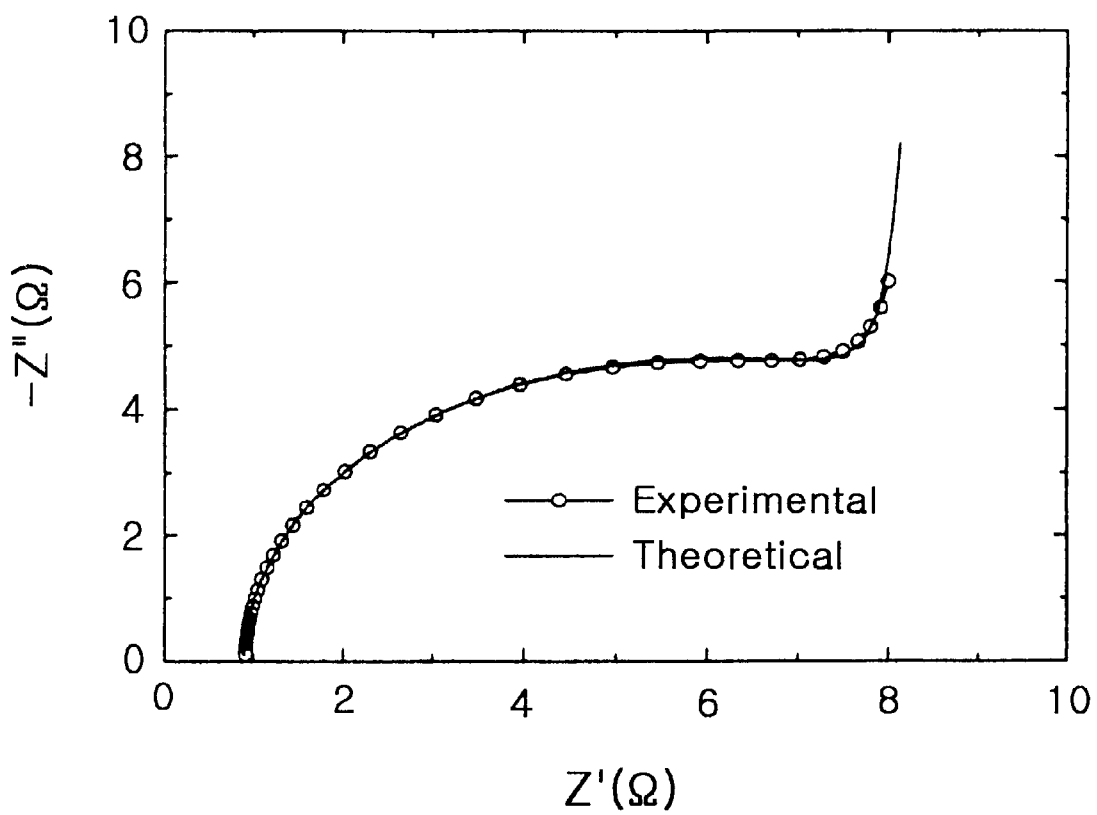
FIG. 3 shows an impedance spectrum obtained by Laplace-transform of the voltage measured in constant load method.

FIG. 3 shows the complex impedance spectrum obtained by the constant load method. The spectrum is accurately identical with the impedance spectrum calculated from the circuit configuration of the dummy cell.

Embodiment 3 (Comparative)

The impedance spectrum obtained by the carrier function Laplace transform method is compared to the impedance spectrum by FFT method.

Figure 4A:
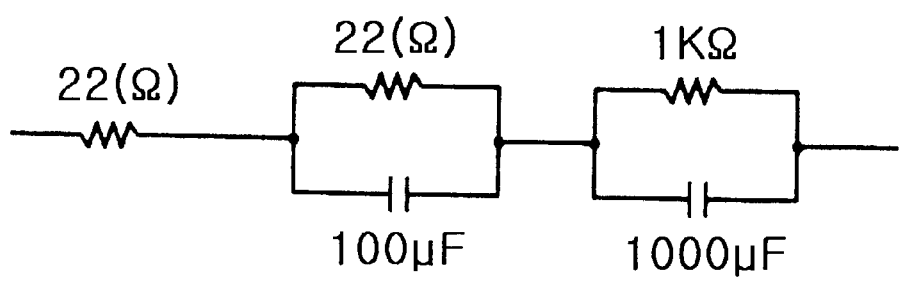
FIG. 4a is a dummy cell consisting of resistors and capacitors.

To the dummy cell configured as the circuit shown in FIG. 4a, current pulse is interrupted after applying current of 0.6 mA for 10 minutes. Variations of voltage and current are measured for 10 minutes in speed of 10 kHz through the filter and amplifier, using the 16 bit analog/digital converter.

The thus-obtained current/voltage data is obtained as the linear fitting of the parameter $K_i$ values of the current/voltage in accordance with the equation 3 and the impedance function is calculated according to the equation 4. The measured response signal is Laplace-transformed using carrier function, thus obtaining the impedance spectrum.

Frequency of the impedance spectrum ranges from 0.1 Hz to 5 kHz.

The measurement of the impedance spectrum by the FFT method is performed by the following steps and apparatus.

The current input signal of superposed sine waves at an odd frequency of minimum frequency 0.1 Hz is applied to battery through the digital/analog converter and galvanostat. The current and voltage signals measured by the analog/digital converter is transmitted to the control means and used for calculating the complex impedance, using fast Fourier transform algorithm.

The impedance obtained by FFT ranges from 0.1 Hz to 18 kHz. Measuring time is 20 seconds.

Figure 4B:
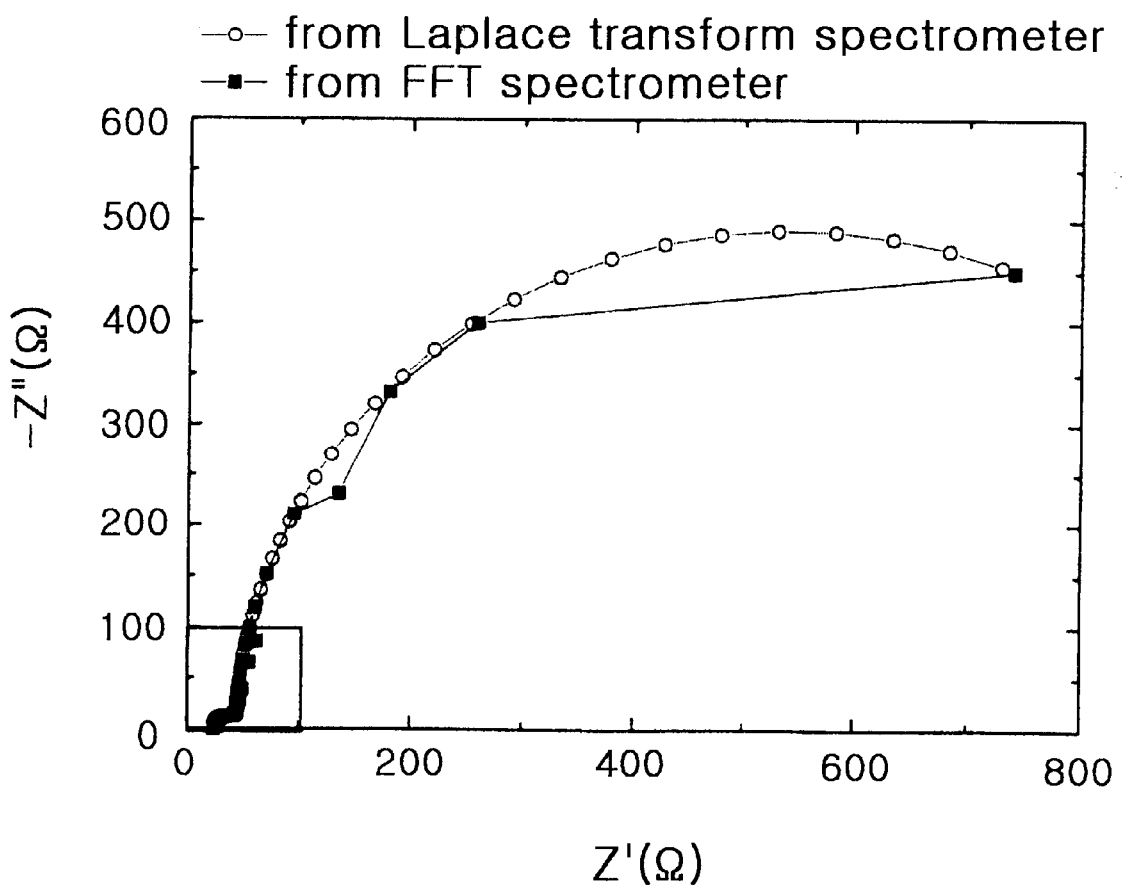
FIG. 4b is a graph comparing an impedance spectrum obtained by carrier Laplace transform of a response signal of the dummy cell of FIG. 4a measured by a current pulse method with an impedance spectrum measured by a fast Fourier transforming method.
Figure 4C:
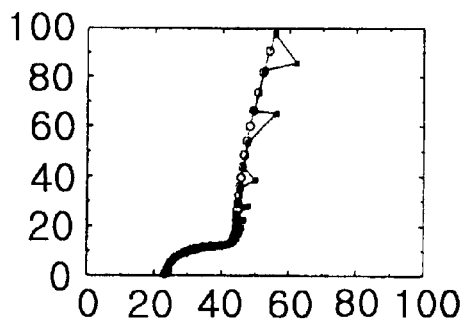
FIG. 4c is a magnified view of the comparison graph of FIG. 4b from 0–100 Ω.

FIGS. 4b and 4c compare the impedance measuring data. From the drawing, we can recognize that the two impedance spectra are identical.

As shown in the graph, the two impedance spectra are completely identical in a high frequency band. But, the impedance spectrum measured by FFT which applies a perturbation signal made of non-overlapping frequencies provides less information in a low frequency region. On the contrary, the impedance spectra from the carrier function Laplace transform is advantageous in increasing the measurement resolution in both the high and low frequency ranges.

Embodiment 4

By making a half cell which consists of an active material $LiCoO_2$ as an operational electrode, the impedance is measured by a current interrupting method. The half cell is configured as of the sandwich type three electrode method. For reference electrode and counter-electrode is used lithium metal and for electrolyte solution is used $LiPF_6$ in EC/DMC (1:1).

Figure 5:
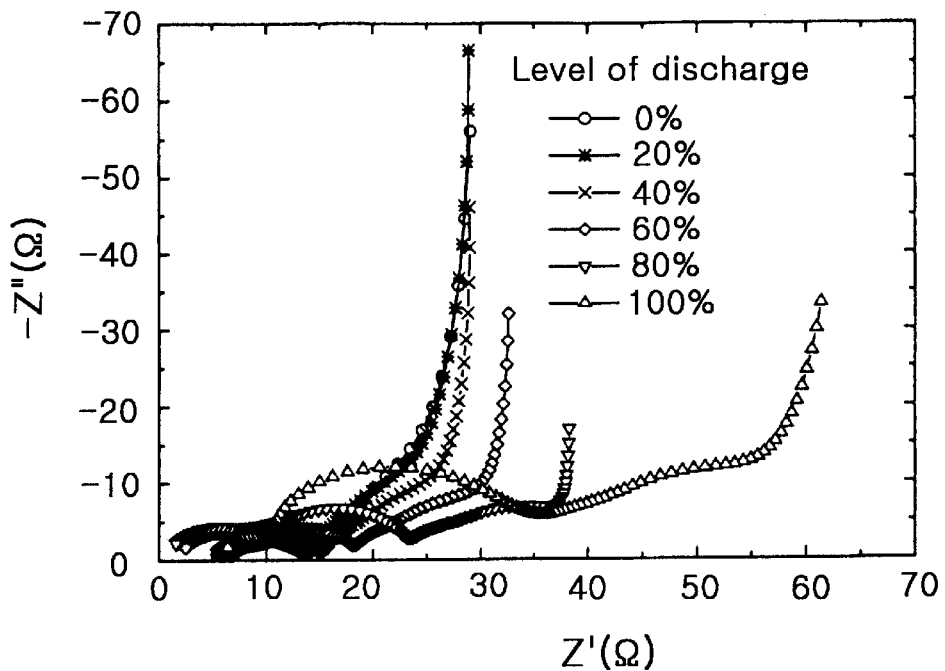
FIG. 5 shows an impedance spectrum obtained by carrier function Laplace-transform of a response signal of a half cell measured by a current interruption method in a charged condition.

The impedance is measured in discharging 20% of the entire capacity in a full charged condition. The impedance is discharged with current of 0.203 mA for 16 minutes and 40 seconds. Then, current is cut off for 1000 seconds to measure the response signal, the current interrupting method being repeated. Used is sample frequency of 500 Hz for this. The response signal of the voltage/current is Laplace transformed, and shown in FIG. 5 as a function of the level of discharge.

Embodiment 5

The impedance spectrum of the primary alkaline battery (manufactured by Duracell Co. Model name: MN1500) is measured by Laplace transform measurement method. Used is the current interruption method where current of 28.5 mA is applied for two hours to discharge battery and the applied current interrupted thereafter.

The response signal is measured for one hour at the sample frequency of 100 Hz, and 1500 response signals of voltage/current are taken at the same intervals with respect to the log value of the time.

The thus-processed response signal is transformed according to the carrier function Laplace transform algorithm, thereby obtaining the impedance spectrum. The response signal is linearly fitted to the carrier function having an analytical Laplace transform to thereby calculate the parameters of the carrier function. The impedance spectrum is then calculated in frequency domain in accordance with parameters for carrier functions.

The measured impedance frequency ranges from 1.8 mHz to 314.2 Hz.

The measurement error of the frequency domain impedance function is calculated out of the standard deviation of the parameters of the calculated Laplace domain impedance function using the covariance matrix of the time domain fit.

Figure 6A:
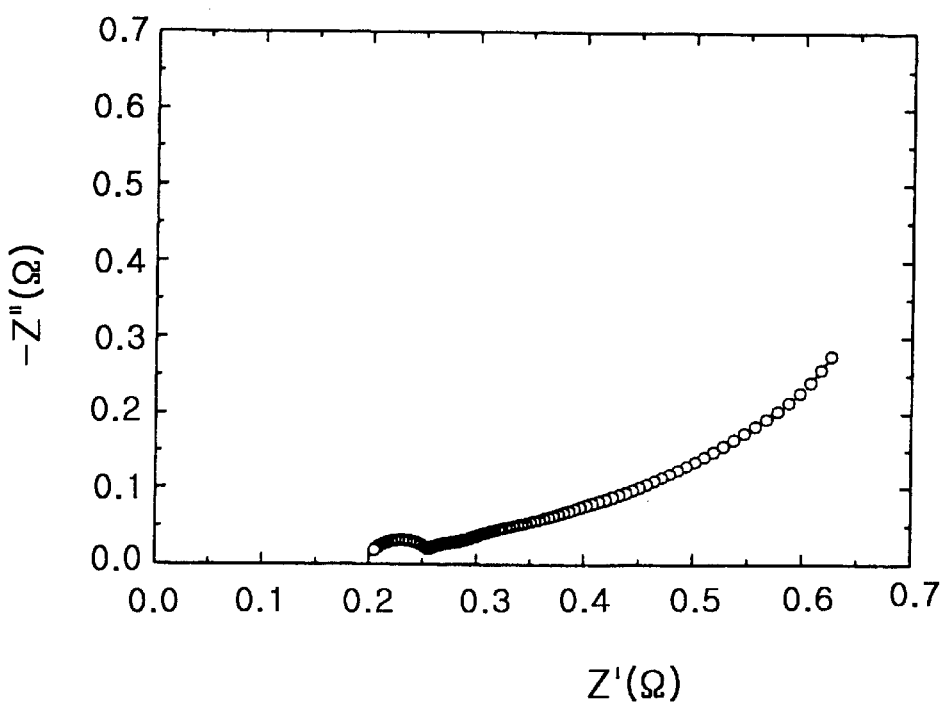
FIGS. 6a, 6b and 6c are graphs showing the result of an impedance spectrum obtained by carrier function Laplace-transform of a response signal of a primary alkaline manganese battery in full charged condition measured by a current interruption method and its error-analysis.
Figure 6B:
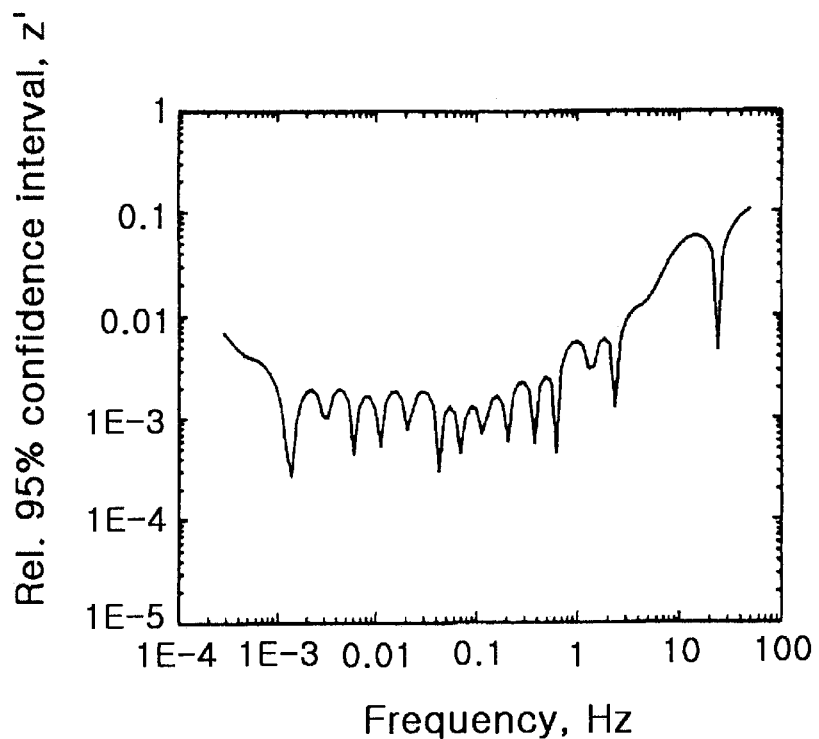
Figure 6C:
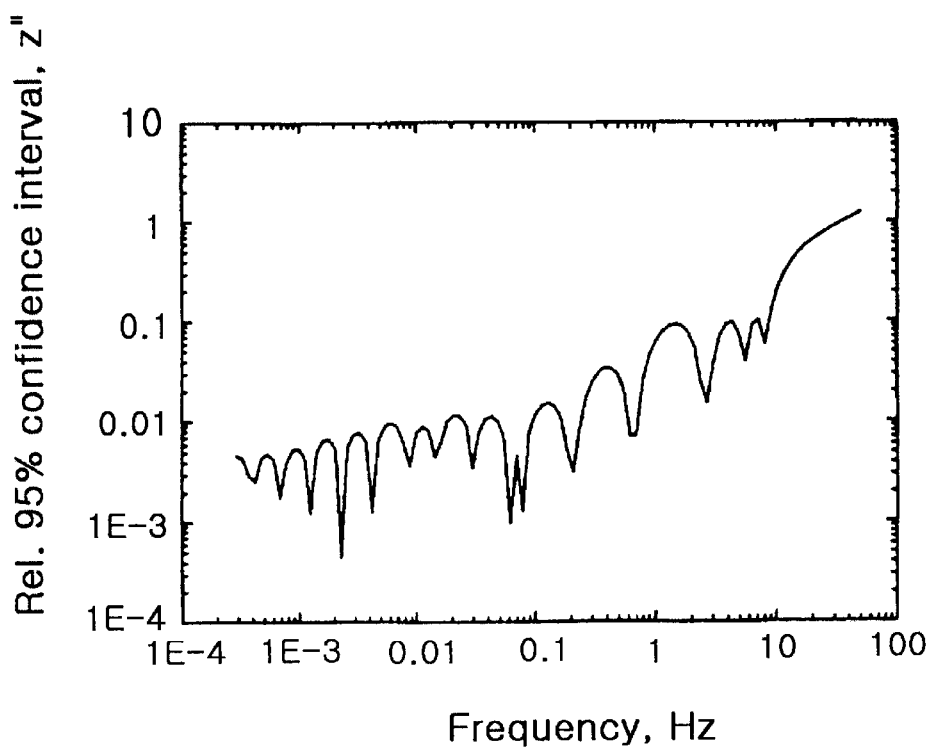

In FIGS. 6b and 6c is shown a frequency dependent function of the measurement error in each section of 95% confidence interval of the real and imaginary values of the impedance.

The error becomes larger in the high frequency band but its size does not exceed 1 Ω, thus being considerably accurate result. It is the additional advantage provided with the present invention, that the carrier function Laplace transform measurement method, determines an error of the resulting measurement.

Embodiment 6

The carrier function Laplace transform impedance measurement is performed, using the current interruption method where a current pulse is applied to the lithium ion battery with norminal capacity of 1300 mAh (manufactured by Matsushita Co.) fully charged using constant current at 10 hours at a room temperature.

The discharge current of 130 mA is applied for 16 minutes and 40 seconds to the battery, and then the applied current is interrupted, thereby the response signal being measured for 1000 seconds. The response signal is sampled at a frequency of 500 Hz. The data for current and voltage each having 500,000 data points are extracted to 2,000 points in the equi-logarithmic spacing in the same time interval.

The step allows to use the 8 Kb memory by extracting the data at a log time interval at the analog/digital converter. The response voltage and current signal are converted according to the carrier function Laplace transform algorithm to thereby obtain impedance spectrum.

Figure 7:
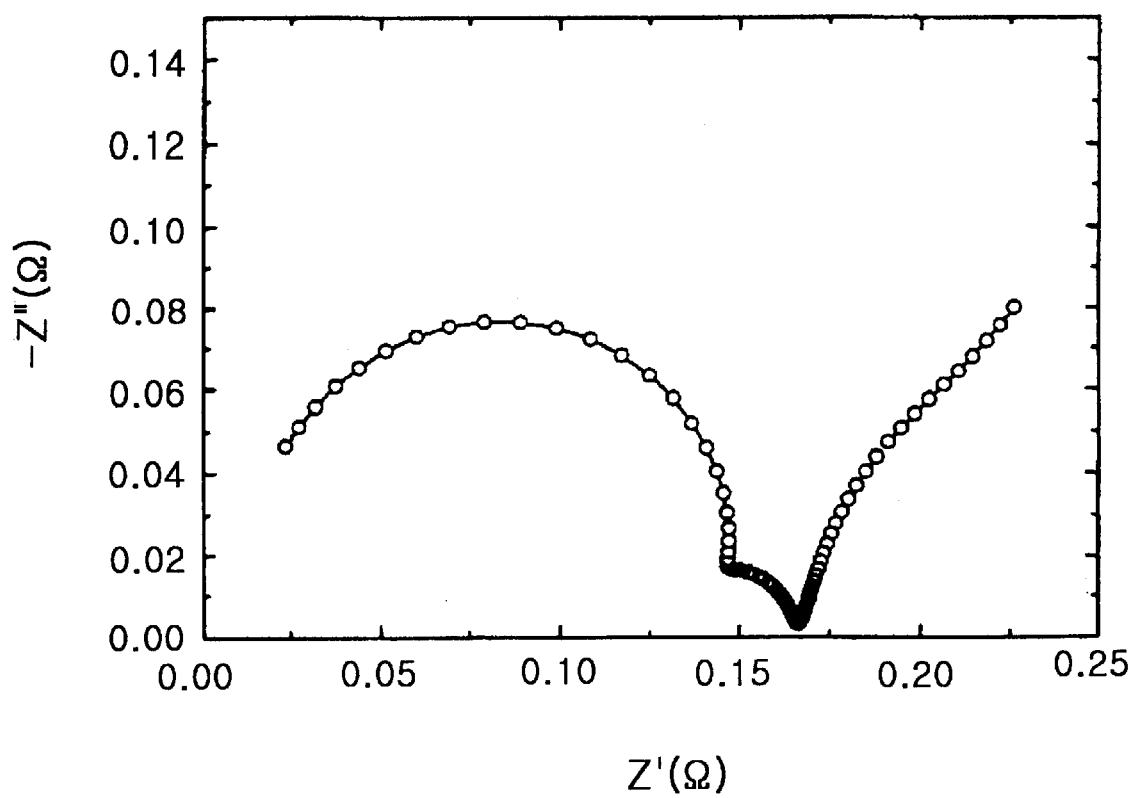
FIG. 7 is a graph showing an impedance spectrum obtained by carrier function Laplace-transform of a response signal from a secondary lithium ion battery in a full charged condition measured in a current interruption method.

FIG. 7 shows the thus-measured impedance spectrum. The frequency of the impedance spectrum ranges from 6.5 mHz to 1.57 kHz.

Industrial Applicability

It will be apparent to those skilled in the art that various modifications and variations can be made in the present invention without departing from the spirit of scope of the invention.

Thus, it is intended that the present invention cover the modifications and variations of this invention.

For example, for the measurement of the excitation signal and response signal for obtaining the impedance spectrum can be used the general analog/digital converter instead of the log time interval extracting apparatus.

Moreover, the low band pass filter is not necessarily used for signal processing.

In case of using the high sensitivity wide band analog-digital converter, the bias signal compensator and signal amplifier may not be used, which is also the case if the bias signal is so small or the size of the response signal is so big within the scope maintaining the linearity of the system for testing.

The present invention is described in detail, focusing on the cases when applying the constant current, constant voltage in which calculation of analytic Laplace transform is relatively simple (current pulse/voltage pulse method), when measuring the response signal after interrupting the applied signal (current interrupt method) and also when applying the excitation signal of constant resistor (constant load method), but other excitation signal can be applied.

Any functions available for analytically transform in the Laplace domain can be used as the Laplace transform carrier function.

It is possible to calculate the parameters of the carrier function by using the non-linear fitting with variable zeros, instead of a fixed zero having log time interval. In a specified case, zeros having other time intervals may be more convenient.

In addition, if the transfer functions of the test device is of interest rather than the individual impedance values at the different frequencies, the impedance function obtained from the Laplace domain can be used directly.

What is claimed is:

1. A method of the carrier function Laplace transform impedance measurement, comprising the steps of:

(1) detecting a response signal of an object whose impedance will be measured;
   (2) obtaining parameters of a carrier function by linearly or non-linearly fitting the response signal in step (1) to the carrier function allowing an analytical Laplace transform;
   (3) calculating an impedance function in the Laplace domain by using an analytic relation between the carrier function in time domain and its Laplace transfer function using parameters of the carrier function obtained from the fitting results in step (2);
   (4) calculating the impedance spectrum in a frequency domain by using the parameters of the Laplace domain impedance function calculated in step (3), and calculating the measurement error of the frequency band impedance function out of the standard deviations of the parameters and its correlation; and
   (5) displaying the frequency domain impedance spectrum calculated in step (4) and storing the result.

2. The method as defined in claim 1, wherein the above step (1) comprises the steps of:

applying a current/voltage pulse to the object to be measured; and
   detecting the voltage and current based on the voltage pulse and current pulse applied as a response signal.

3. The method as defined in claim 1, wherein step (1) comprises the steps of:

applying a voltage pulse or a current pulse to the measurement object followed by physical interruption of the contact between current or voltage source at the instant of the beginning of the measurement; and
   determining the voltage after the interruption as the response signal.

4. The method as defined in claim 1, wherein in step (1) a constant resistor is connected in the instant of the beginning of the measurement so as to short terminals of the measurement object and thereby provide excitation followed by detection of voltage response signal.

* * * * *

UNITED STATES PATENT AND TRADEMARK OFFICE
CERTIFICATE OF CORRECTION

PATENT NO.     : 6,502,046 B1
DATED          : December 31, 2002
INVENTOR(S)    : Yoon et al.

It is certified that error appears in the above-identified patent and that said Letters Patent is hereby corrected as shown below:

<u>Title page,</u>
Item [73], Assignee, replace "Korea Kumbo Petrochemical Co. Ltd." with
-- Korea Kumho Petrochemical Co. Ltd. --

Signed and Sealed this

Thirteenth Day of May, 2003

JAMES E. ROGAN
*Director of the United States Patent and Trademark Office*